(12) United States Patent
Kato et al.

(10) Patent No.: US 7,089,680 B1
(45) Date of Patent: Aug. 15, 2006

(54) VACUUM PROCESSING APPARATUS AND OPERATING METHOD THEREFOR

(75) Inventors: Shigekazu Kato, Kudamatsu (JP); Kouji Nishihata, Tokuyama (JP); Tsunehiko Tsubone, Hikari (JP); Atsushi Itou, Kadamatsu (JP)

(73) Assignee: Hitachi, Ltd., Tokyo (JP)

( * ) Notice: Subject to any disclaimer, the term of this patent is extended or adjusted under 35 U.S.C. 154(b) by 815 days.

(21) Appl. No.: 09/766,596

(22) Filed: Jan. 23, 2001

Related U.S. Application Data

(60) Division of application No. 09/461,432, filed on Dec. 16, 1999, now Pat. No. 6,330,755, which is a continuation of application No. 09/177,495, filed on Oct. 23, 1998, now Pat. No. 6,012,235, which is a continuation of application No. 09/061,062, filed on Apr. 16, 1998, now Pat. No. 5,950,330, which is a continuation of application No. 08/882,731, filed on Jun. 26, 1997, now Pat. No. 5,784,799, which is a division of application No. 08/593,870, filed on Jan. 30, 1996, now Pat. No. 5,661,913, which is a continuation of application No. 08/443,039, filed on May 17, 1995, now Pat. No. 5,553,396, which is a division of application No. 08/302,443, filed on Sep. 9, 1994, now Pat. No. 5,457,896, which is a continuation of application No. 08/096,256, filed on Jul. 26, 1993, now Pat. No. 5,349,762, which is a continuation of application No. 07/751,952, filed on Aug. 29, 1991, now abandoned.

(30) Foreign Application Priority Data

Aug. 29, 1990 (JP) .................................. 02-225321

(51) Int. Cl.
*F26R 13/30* (2006.01)

(52) U.S. Cl. ................. 34/92; 34/60; 134/85; 134/902; 414/939; 414/940

(58) Field of Classification Search .................... 34/60, 34/92, 218, 228, 229, 232; 414/939, 940, 414/225, 226, 207, 217, 222, 231; 134/84, 134/85, 902; 156/345, 345 C, 345 PC; 118/723 F, 118/723 I, 730, 719
See application file for complete search history.

(56) References Cited

U.S. PATENT DOCUMENTS 3,652,444 A    3/1972  Lester et al.

(Continued)

FOREIGN PATENT DOCUMENTS

EP          20246453        4/1987

(Continued)

OTHER PUBLICATIONS

R.P.H. Chang, "Multipurpose plasma reactor for materials research and processing", J. Vac. Sci. Technol., vol. 14, No. 1, Jan./Feb. 1977, pp. 278-280.

(Continued)

*Primary Examiner*—Kenneth Rinehart
(74) *Attorney, Agent, or Firm*—Antonelli, Terry, Stout and Kraus, LLP.

(57) ABSTRACT

A vacuum processing apparatus which includes a means for transferring substrates from a loader, with a transferring device, to a double lock chamber; and, then to a selected vacuum processing chamber. The substrates are returned to a substrate, by the vacuum loader, into their original position in the substrate table. The surfaces of the substrates are maintained in a horizontal position during processing.

24 Claims, 1 Drawing Sheet

U.S. PATENT DOCUMENTS

| | | |
|---|---|---|
| 3,981,791 A | 9/1976 | Rosvold |
| 4,138,306 A | 2/1979 | Niwa .......................... 156/345 |
| 4,226,897 A | 10/1980 | Coleman |
| 4,311,427 A | 1/1982 | Coad et al. |
| 4,313,783 A | 2/1982 | Davies et al. |
| 4,313,815 A | 2/1982 | Graves, Jr. et al. |
| 4,318,767 A | 3/1982 | Hijikata et al. |
| 4,449,885 A | 5/1984 | Hertel et al. |
| 4,457,661 A | 7/1984 | Flint et al. |
| 4,534,314 A | 8/1985 | Ackley |
| 4,563,240 A | 1/1986 | Shibata et al. |
| 4,576,698 A | 3/1986 | Gallagher et al. .......... 204/192 |
| 4,634,331 A | 1/1987 | Hertel |
| 4,643,629 A | 2/1987 | Takahashi et al. .......... 414/331 |
| 4,705,951 A | 11/1987 | Layman et al. |
| 4,715,764 A | 12/1987 | Hutchinson |
| 4,824,309 A | 4/1989 | Kakehi et al. ............... 414/217 |
| 4,836,733 A | 6/1989 | Hertel et al. |
| 4,836,905 A | 6/1989 | Davis et al. |
| 4,851,101 A | 7/1989 | Hutchinson |
| 4,895,107 A | 1/1990 | Yano et al. |
| 4,902,934 A | 2/1990 | Miyamura et al. |
| 4,903,937 A | 2/1990 | Jakubiec et al. |
| 4,909,695 A | 3/1990 | Hurwitt et al. |
| 4,911,597 A | 3/1990 | Maydan et al. |
| 4,915,564 A | 4/1990 | Eror et al. |
| 4,917,556 A | 4/1990 | Stark et al. |
| 4,923,584 A | 5/1990 | Bramhall, Jr. et al. |
| 4,924,890 A | 5/1990 | Giles et al. ................. 134/902 |
| 4,936,329 A | 6/1990 | Michael et al. ............. 134/902 |
| 4,951,601 A | 8/1990 | Maydan et al. ......... 414/217 X |
| 4,969,790 A | 11/1990 | Petz et al. |
| 5,007,981 A | 4/1991 | Kawasaki et al. |
| 5,014,217 A | 5/1991 | Savage ....................... 364/550 |
| 5,248,886 A * | 9/1993 | Asakawa et al. ...... 250/442.11 |
| 5,292,393 A | 3/1994 | Maydan et al. |
| 5,351,415 A | 10/1994 | Brooks et al. ................. 34/389 |
| 5,436,848 A | 7/1995 | Nishida et al. |
| 5,452,166 A | 9/1995 | Aylwin et al. |
| 5,462,397 A | 10/1995 | Iwabuchi .................... 414/222 |
| 5,504,033 A | 4/1996 | Bajor et al. |
| 5,504,347 A | 4/1996 | Jovanovic et al. |
| 5,509,771 A | 4/1996 | Hiroki ........................ 414/217 |
| 5,536,128 A | 7/1996 | Shimoyashiro et al. |
| 5,556,714 A | 9/1996 | Fukuyama et al. |
| 5,651,858 A | 7/1997 | Lin |
| 5,675,461 A | 10/1997 | Aylwin et al. |
| 5,685,684 A | 11/1997 | Kato et al. .................. 414/217 |
| 6,235,634 B1 * | 5/2001 | White et al. ................ 438/680 |

FOREIGN PATENT DOCUMENTS

| | | |
|---|---|---|
| EP | 20381338 | 5/1990 |
| JP | 5729577 | 2/1982 |
| JP | 60246635 | 12/1985 |
| JP | SHO-61-173445 | 8/1986 |
| JP | 6244571 | 2/1987 |
| JP | 6250463 | 3/1987 |
| JP | 6289881 | 4/1987 |
| JP | 62-216315 | 9/1987 |
| JP | 62207866 | 9/1987 |
| JP | 63-133521 | 6/1988 |
| JP | 63153270 | 6/1988 |
| JP | 636582 | 1/1989 |
| JP | 6412037 | 1/1989 |
| JP | 64-038042 | 2/1989 |
| JP | 131970 | 2/1989 |
| JP | 131971 | 2/1989 |
| JP | 1135015 | 5/1989 |
| JP | 1251734 | 10/1989 |
| JP | 1298180 | 12/1989 |
| JP | 1310553 | 12/1989 |
| JP | 02-065252 | 3/1990 |
| JP | 261064 | 3/1990 |
| JP | 265252 | 3/1990 |
| JP | 294647 | 4/1990 |
| JP | 2106037 | 4/1990 |
| JP | 02-178946 | 7/1990 |
| JP | 430549 | 4/1992 |
| JP | 63-153270 | 6/1998 |
| WO | 8707309 | 5/1987 |

OTHER PUBLICATIONS

Semiconductor Equipment Association of Japan, "Terminological Dictionary of Semiconductor Equipment", front, table, p. 183, back, Nov. 20, 1987.

Semiconductor Equipment Association of Japan, "Semiconductor News", vol. 4, pp. 38-43, Apr. 10, 1987 (w/ translation).

Decision on Opposition No. 2001.72514 relating to JP 3145359, Patentee Hitachi, Ltd., pp. 1-27, Nov. 20, 2002.

Decision on Opposition No. 2001.72518 relating to JP 3145375, Patentee Hitachi, Ltd., pp. 1-28, Nov. 20, 2002.

Decision on Opposition No. 2001.72519 relating to JP 3145376, Patentee Hitachi, Ltd., pp. 1-23, Nov. 20, 2002.

Decision on Opposition No. 2001.72574 relating to JP 3147230, Patentee Hitachi, Ltd., pp. 1-22, Nov. 20, 2002.

S. Nakagawa, "Dry Etching", Drafts in Symposium of VLSI and FA Technology, Apr. 1985, pp. 1-14.

N. Nagsi, "Parallel-Implantation Ion Implantation Device NH-20SP", Special Issue/Semiconductor Manufacturing Device of Half-Micron Age, pp. 1-12, Mar. 1990.

* cited by examiner

VACUUM PROCESSING APPARATUS AND OPERATING METHOD THEREFOR

This application is a Divisional application of application Ser. No. 09/461,432, filed Dec. 16, 1999, now U.S. Pat. No. 6,330,755, which is a Continuation application of application Ser. No. 09/177,495, filed Oct. 23, 1998, now U.S. Pat. No. 6,012,235 which is a Continuation application of application Ser. No. 09/061,062, filed Apr. 16, 1998, now U.S. Pat. No. 5,950,330 which is a Continuation application of application Ser. No. 08/882,731, filed Jun. 26, 1997, now U.S. Pat. No. 5,784,799 which is a Divisional application of application Ser. No. 08/593,870, filed Jan. 30, 1996, now U.S. Pat. No. 5,661,913 which is a Continuing application of application Ser. No. 08/443,039, filed May 17, 1995, now U.S. Pat. No. 5,553,396 which is a Divisional application of application Ser. No. 08/302,443, filed Sep. 9, 1994, now U.S. Pat. No. 5,457,896 which is a Continuing application of application Ser. No. 08/096,256, filed Jul. 26, 1993, now U.S. Pat. No. 5,349,762 which is a Continuing application of application Ser. No. 07/751,952, filed Aug. 29, 1991 now abandoned.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparatus and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988. This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual gas used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means for storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction-products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
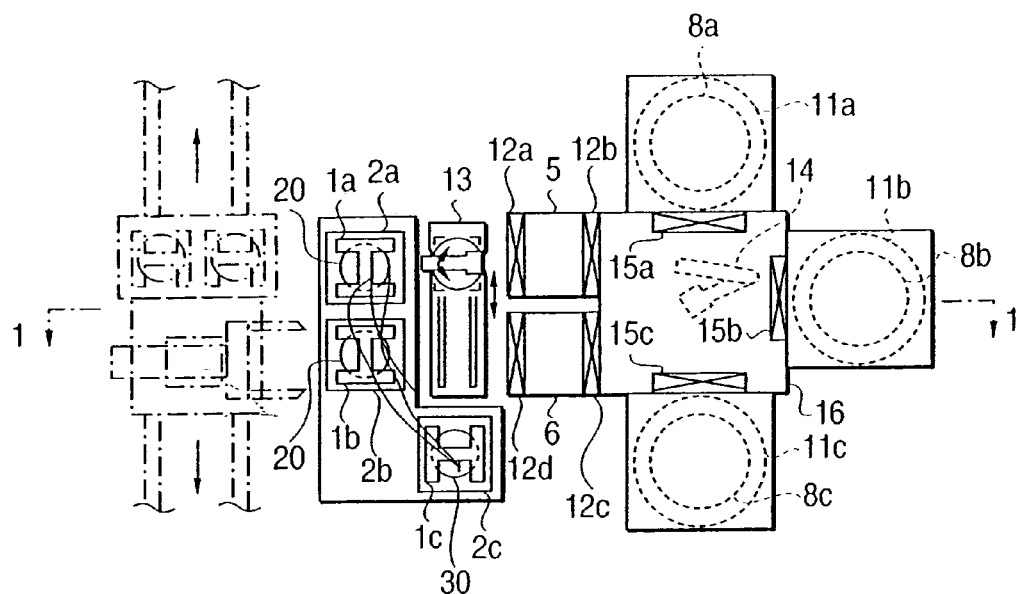
FIG. 1 is a plan view of a dry etching apparatus as an embodiment of a vacuum processing apparatus in accordance with the present invention.
Figure 2:
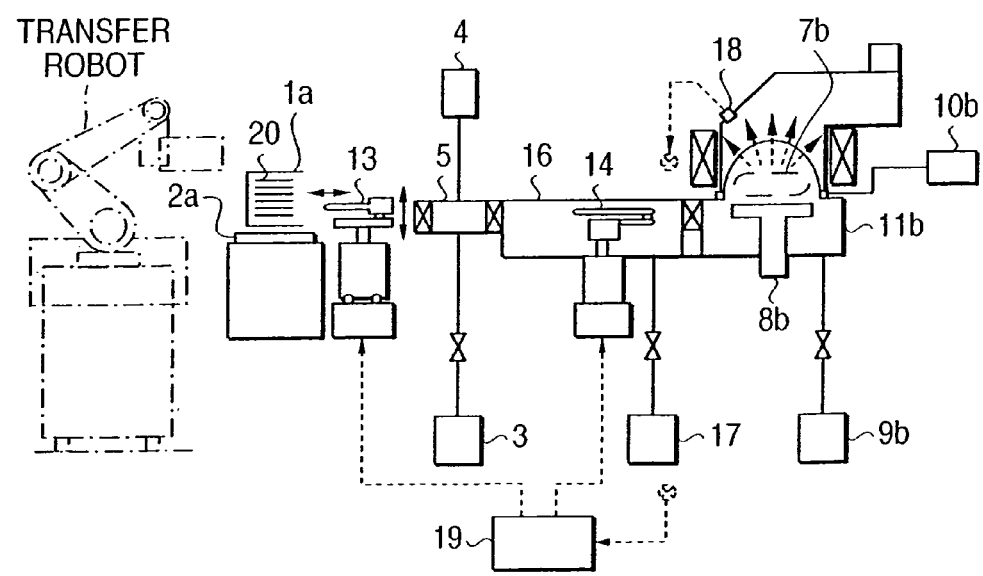
FIG. 2 is a vertical sectional view taken along line 1—1 of FIG. 1.

FIGS. 1 and 2 show a vacuum processing apparatus of the present invention which is, in this case, a dry-etching apparatus for etching wafers, i.e., substrates to be processed by plasma.

Cassette tables 2a to 2c are disposed in an L-shape in this case in positions such that they can be loaded into and unloaded from the apparatus without changing their positions and postures. In other words, the cassettes 1a to 1c are fixed always in predetermined positions on a substantially horizontal plane, while the cassette tables 2a and 2b are disposed adjacent to and in parallel with each other on one of the sides of the L-shape. The cassette table 2c is disposed on the other side of the L-shape. The cassettes 1a and 1b are for storing unprocessed wafers and for recovering the processed wafers. They can store a plurality (usually 25) of wafers 20 as the substrates to be treated. The cassette 1c in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables 2a and 2b, and a conveyor 13 is disposed between the cassette tables 2a, 2b and the load lock chamber 5 and the unload lock chamber 6. The load lock chamber 5 is equipped with an evacuating device 3 and a gas introduction device 4, and can load unprocessed wafers in the vacuum apparatus through a gate valve 12a. The unload lock chamber 6 is similarly equipped with the evacuating device 3 and the gas introduction device 4, and can take out processed wafers to the atmosphere through a gate valve 12d. The conveyor 13 is equipped with a robot having X, Y, Z and θ axes, which operates so as to deliver and receive the wafers 20 between the cassettes 1a, 1b and the load lock and unload lock chambers 5 and 6 and the dummy wafers 30 between the cassette 1c and the load lock and unload lock chambers 5 and 6.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through gate valves 15a, 15b and 15c, respectively. A conveyor 14 capable of delivering the wafers 20 or the dummy wafers 30 from the load lock chamber 5 to the etching chambers 11a, 11b, 11c and of delivering them from the chambers 11a, 11b, 11c to the unload lock chamber 6 is disposed inside the transfer chamber 16. The transfer chamber 16 is equipped with an evacuating device 17 capable of independent evacuation.

The etching chambers 11a, 11b, 11c have the same structure and can make the same processing. The explanation will be given on the etching chamber 11b by way of example. The etching chamber 11b has a sample table 8b for placing the wafers 20 thereon, and a discharge chamber is so provided as to define a discharge portion 7b above the sample table 8b. The etching chamber 11b includes a gas introduction device 10b for introducing a processing gas in the discharge portion 7b and an evacuating device 9b for decreasing the internal pressure of the etching chamber 11b to a predetermined pressure. The etching chamber 11b further includes generation means for generating a microwave and a magnetic field for converting processing gas in the discharge portion 7b to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette 1c and the etching chambers 11a to 11c.

In a vacuum processing apparatus having the construction described above, the cassettes 1a, 1b storing unprocessed wafers are first placed onto the cassette tables 2a, 2b by a line transfer robot which operates on the basis of the data sent from a host control apparatus, or by an operator. On the other hand, the cassette 1c storing the dummy wafers is placed on the cassette table 2c. The vacuum processing apparatus executes the wafer processing or plasma cleaning on the basis of recognition by itself of the production data provided on the cassettes 1a to 1c, of the data sent from the host control apparatus, or of the command inputted by an operator.

For instance, the wafers 20 are sequentially loaded in the order from above into the etching chambers 11a, 11b, 11c by the conveyors 13 and 14, and are etched. The etched wafers are stored in their original positions inside the cassette 1a by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers 11a to 11c. Therefore, the original state must be recovered by removing the adhering matters by plasma cleaning. The controller 19 judges the timing of this plasma cleaning. In this case, a portion through which the plasma light passes is provided in each of the etching chambers 11a to 11c. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing of wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in any position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber ha through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 1c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism for conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times of use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. A conveyor system for processing substrates in plural vacuum processing chambers, the conveyor system including:
    a loader;
    a vacuum loader; and
    double lock chambers, having a loader side and a vacuum loader side, and having a gate valve for said loader side and another gate valve for said vacuum loader side, wherein said vacuum loader has
    (1) a transfer chamber connected to said double lock chambers via the another gate valve;
    (2) a conveyor structure; and
    (3) plural vacuum processing chambers,
    wherein said loader has a transfer device transferring substrates to be processed from a cassette in said loader to one of said double lock chambers,
    wherein said vacuum loader has said conveyor structure which transfers substrates to be processed, from said one of the double lock chambers to at least one of said plural vacuum processing chambers, via said transfer chamber;
    wherein each of said plural vacuum processing chambers has a substrate table to maintain a surface of a substrate, treated in the at least one of the plural vacuum processing chambers, horizontal during a vacuum processing,
    wherein said conveyor structure in said vacuum loader transfers processed substrates from said at least one of said plural vacuum processing chambers to one of said double lock chambers, via said transfer chamber, and
    wherein said transfer device in said loader returns said substrates from the other one of the double lock chambers to their original positions in the cassette in which said substrates are stored prior to processing, surfaces of the substrates which have been processed being kept horizontal when said transfer device returns said substrates.

2. The conveyor system according to claim 1, wherein said substrates are transferred between said either one of the double lock chambers and the at least one of said plural vacuum processing chambers by said conveyor structure, said conveyor structure being a single conveyor located in said transfer chamber.

3. The conveyor system according to claim 1, wherein, in transferring said substrates between said one of the double lock chambers and the at least one of said plural vacuum processing chambers, said substrates are transferred via said transfer chamber of said vacuum loader, and gate valves therefor.

4. The conveyor system according to claim 1, wherein said substrates are semiconductor wafers.

5. The conveyor system according to claim 1, wherein substrates to be processed are transferred one by one from said one of the lock chambers to said at least one of said plural vacuum processing chambers, via the transfer chamber;
    wherein the substrate are processed one by one in each of the plural vacuum processing chambers; and
    wherein processed substrates are transferred one by one from the at least one of the plural vacuum processing chambers to one of said double lock chambers, via said transfer chamber.

6. The conveyor system according to claim 1, wherein said substrates to be processed are transferred directly from said loader to said one of the double lock chambers.

7. A conveyor system used for transferring substrates to be processed to vacuum processing chambers, comprising:
    a conveyor for transferring said substrates to be processed in said vacuum processing chambers from a loader to one of double lock chambers;
    a vacuum providing device in said one of the double lock chambers, after substrates to be processed have been transferred thereto; and
    another conveyor, for transferring the substrates from said one of the double lock chambers to a vacuum loader, said vacuum loader loading said substrates into said vacuum processing chambers, said vacuum loader having gate valves for introducing substrates into said vacuum processing chambers and also having a transfer chamber and a conveyor structure, and
    said conveyor in said loader returns said substrates from the other one of the double lock chambers to their original positions in the cassette in which said substrates are stored prior to processing, surfaces of the substrates which have been processed being kept horizontal when the conveyor returns said substrates.

8. The conveyor system according to claim 7, wherein the substrates are semiconductor wafers.

9. The conveyor system according to claim 7, wherein said conveyor structure is a single conveyor, which transfers said substrates, one by one, between said one of the double lock chambers and said vacuum processing chambers.

10. The conveyor system according to claim 7, wherein said substrates are transferred one by one between said one of said double lock chambers and said vacuum processing chambers.

11. The conveyor system according to claim 7, wherein said substrates to be processed are transferred directly from said atmospheric loader to said one of the double lock chambers.

12. An apparatus for transferring cassettes in operating a vacuum processing apparatus, the vacuum processing apparatus including:
    a loader;
    a vacuum loader; and
    double lock chambers for connecting said loader and said vacuum loader,
    wherein said loader includes a cassette mount unit located outside of said double lock chambers, said cassette mount unit has a cassette positioning plane which is a substantially horizontal plane in which all cassettes, containing samples to be processed, are positioned in a row in front of a front wall of said double lock chambers, and said cassette positioning plane is oriented such that a cassette is placed on and removed from said cassette positioning plane so as to maintain the surface of a sample to be processed substantially horizontal when the cassette containing the sample is on the cassette positioning plane, wherein the sample is transferred by a transfer device in said loader from said loader to one lock chamber of the double lock chambers, while maintaining the surface of the sample to be processed substantially horizontal, and wherein said transfer device returns said samples from the other one of the double lock chambers to their original positions in said cassette in which said samples are stored prior to processing, surfaces of the samples which have been processed being kept horizontal in returning the samples to their original positions.

13. An apparatus for transferring cassettes in operating a vacuum processing apparatus, the vacuum processing apparatus including:

a loader;

a vacuum loader; and double lock chambers for connecting said loader and said vacuum loader, wherein said loader includes a cassette mount unit located outside of said double lock chambers, said cassette mount unit has a cassette positioning plane which is a substantially horizontal plane in which all cassettes, containing samples to be processed, are positioned in a row in front of a front wall of said lock chambers, and said cassette positioning plane is oriented such that a cassette is placed on and removed from said cassette positioning plane so as to maintain a surface of a sample to be processed substantially horizontal when the cassette containing the sample is on the cassette positioning plane; and an automatic cassette loader for loading cassettes on said cassette mount unit so as to maintain the sample surface to be processed substantially horizontal, wherein the cassette is removed from said cassette positioning plane of said cassette mount unit by said automatic cassette loader, in accordance with data sent from a host control apparatus, while maintaining the sample surface substantially horizontal, and said vacuum processing apparatus automatically executes a sample processing, based on processing data, and wherein a transfer device in said loader returns the samples from one of the double lock chambers to their original positions in said cassette in which said samples are stored prior to processing thereof, the sample surface being kept horizontal when the transfer device returns the samples.

14. An apparatus for vacuum processing a substrate by using plural vacuum processing chambers, comprising:

a transfer conveyor for carrying in the substrate into one vacuum processing chamber of said plural vacuum processing chambers, via one lock chamber selected from double lock chambers, said transfer conveyor carrying out the substrate processed in said vacuum processing chamber via another lock chamber of the double lock chambers, and said transfer conveyor returns the substrate from said another lock chamber of the double lock chambers to its original position in said cassette in which said substrate is stored prior to processing thereof, a surface of the substrate which has been processed being kept horizontal when the transfer conveyor returns the substrate.

15. The apparatus according to claim 14, wherein carrying in and carrying out of said substrate are performed sequentially.

16. The apparatus according to claim 14, wherein at least one of dry etching, chemical vapor deposition and sputtering is performed in said plural vacuum processing chambers.

17. An apparatus for vacuum processing a substrate by using plural vacuum processing chambers, such that the substrates are processed one by one, comprising:

a transfer conveyor for carrying in a substrate into at least one of the vacuum processing chambers, via a lock chamber of double lock chambers, wherein said substrate is carried in from a cassette which is placed on a cassette table, said substrate being processed in said at least one of said vacuum processing chambers, wherein said transfer conveyor carries out said substrate, processed in said at least one of said vacuum processing chambers, via another lock chamber of said double load lock chambers, wherein said transfer conveyor includes a first conveyor, of a loader, that faces to a set of substrates disposed in the cassette and transfers said substrates one by one to the lock chamber, and a second conveyor that is disposed in a conveyor chamber of a vacuum loader, and wherein said first conveyor in said loader returns the substrates from said another of the double lock chambers to their original positions in said cassette in which said substrates are stored prior to processing thereof, surfaces of the substrates which have been processed being kept horizontal when the first conveyor returns the substrates.

18. The apparatus according to claim 17, wherein the substrate is carried directly from the cassette on the cassette table, into said one of the lock chambers, and said first conveyor carries the substrate directly from the another lock chamber to the cassette.

19. An apparatus for vacuum processing a substrate by using plural vacuum processing chambers, comprising:

a transfer conveyor for carrying in said substrate, disposed in an atmosphere different from an atmosphere in one of said plural vacuum processing chambers, into said one of the plural vacuum processing chambers, via one lock chamber selected from double lock chambers, wherein the substrate is carried in from a cassette which is placed on a cassette table, to the one of the plural vacuum processing chambers processing the substrate; and said transfer conveyor carrying out the substrate, processed in the one of the plural vacuum processing chambers, into said atmosphere different from said atmosphere in the one of the plural vacuum processing chambers, via another lock chamber of the double lock chambers, wherein the transfer conveyor includes a first conveyor, in a loader, that faces to a set of substrates disposed in the cassette and transfers the substrates one by one to the one lock chamber, and a second conveyor is disposed in a conveyor chamber of a vacuum loader so as to make a rotative movement and a horizontal movement of X and Y axes, and said first conveyor in said loader returns said substrates from said another double lock chamber to their original positions in the cassette in which said substrates are stored prior to processing thereof, surfaces of the substrates which have been processed being kept horizontal when the first conveyor returns the substrates.

20. The apparatus according to claim 19, wherein the substrate is carried directly from the cassette on the cassette table, into said one lock chamber.

21. A vacuum processing apparatus, including:
(a) a plurality of cassette mount tables for mounting cassettes storing substrates;
an atmospheric transfer device for transferring said substrates in an atmosphere;
a plurality of vacuum processing chambers for processing said substrates one by one;
a load lock chamber for loading non-processed substrates from the atmosphere into one vacuum processing chamber of said vacuum processing chambers; and
an unload lock chamber for unloading processed substrates from one vacuum processing chamber of said vacuum processing chambers to the atmosphere;
(b) said plurality of cassette mount tables being located at a front side of said atmospheric transfer device and arranged on a substantially horizontal plane;
(c) said load lock chamber and said unload lock chamber being positioned at a rear side of said atmospheric transfer device;
(d) said load lock chamber having, at an atmospheric side and a vacuum side, gate valves opened or closed every time each of said non-processed substrates is loaded or unloaded one by one, for changing over said load lock chamber to either the atmosphere or the vacuum;
(e) said unload lock chamber having, at an atmospheric side and a vacuum side, gate valves opened or closed every time each of said processed substrates is loaded or unloaded one by one, for changing over said unload lock chamber to either the atmosphere or the vacuum;
(f) said atmospheric transfer device being capable of moving at least vertically and being controlled by control means such that each of said non-processed substrates can be taken out of any location in said plurality of cassettes mounted on said plurality of cassette mount tables for transferring to said load lock chamber one by one through said atmospheric side gate valve, and
each of said processed substrates can be transferred one by one from said unload lock chamber to the original location of the original cassette, in which each of said substrates is stored prior to processing, through said atmospheric side gate valve.

22. A vacuum processing apparatus, including:
(a) a plurality of cassette mount tables for mounting cassettes storing substrates;
an atmospheric transfer device for transferring said substrates in an atmosphere;
a plurality of vacuum processing chambers for processing said substrates;
a load lock chamber for loading non-processed substrates from the atmosphere into said vacuum processing chambers; and
an unload lock chamber for unloading processed substrates from said vacuum processing chambers to the atmosphere;
(b) said plurality of cassette mount tables being located at a front side of said atmospheric transfer device and arranged on a substantial horizontal plane;
(c) said load lock chamber and said unload lock chamber being positioned at a rear side of said atmospheric transfer device;
(d) said load lock chamber having, at an atmospheric side and a vacuum side, gate valves opened or closed every time at least one of said non-processed substrates is loaded or unloaded, for changing over said load lock chamber to either the atmosphere or the vacuum;
(e) said unload load chamber having, at an atmospheric side and a vacuum side, gate valves opened or closed every time at least one of said processed substrates is loaded or unloaded, for changing over said unload lock chamber to either the atmosphere or the vacuum;
(f) said atmospheric transfer device being capable of moving at least vertically and being controlled by control means such that said non-processed substrates can be taken out of any location in said plurality of cassettes mounted on said plurality of cassette mount tables for transferring to said load lock chamber through said atmospheric side gate valve, and
said processed substrates can be transferred from said unload lock chamber to the original locations of the original cassettes, in which the substrates are stored prior to processing, through said atmospheric side gate valve.

23. A vacuum processing apparatus, including:
(a) a plurality of cassette mount tables for mounting cassettes storing substrates;
an atmospheric transfer device for transferring said substrates in an atmosphere;
a plurality of vacuum processing chambers for processing said substrates;
double lock chambers either for loading non-processed substrates from the atmosphere into said vacuum processing chambers or for unloading processed substrates from said vacuum processing chambers to the atmosphere;
(b) said plurality of cassette mount tables being located at a front side of said atmospheric transfer device and arranged on a substantial horizontal plane;
(c) said double lock chambers being positioned at a rear side of said atmospheric transfer device;
(d) said double lock chambers having, at an atmospheric side and a vacuum side, gate valves opened or closed every time at least one of said non-processed substrates is loaded or unloaded for changing over said double lock chambers to either the atmosphere or the vacuum;
(e) said atmospheric transfer device being capable of moving at least vertically and being controlled by control means such that at least one of said non-processed substrates can be taken out of any location in said plurality of cassettes mounted on said plurality of cassette mount tables for transferring to said double lock chambers through said atmospheric side gate valve, and said processed substrates can be transferred from said double lock chambers to the original locations of the original cassettes, in which the substrates are stored prior to processing, through said atmospheric side gate valve.

24. An apparatus for vacuum processing a substrate, comprising:

plural vacuum processing chambers;

a transfer conveyor for carrying in the substrate into one vacuum processing chamber of said plural vacuum processing chambers, via one lock chamber selected from double lock chambers, said transfer conveyor carrying out the substrate processed in said vacuum processing chamber via another lock chamber of the double lock chambers, and said transfer conveyor returns the substrate from said another lock chamber of the double lock chambers to its original position in a cassette, of plural cassettes, in which said substrate is stored prior to processing thereof.

* * * * *